(12) United States Patent
Li et al.

(10) Patent No.: US 9,099,593 B2
(45) Date of Patent: Aug. 4, 2015

(54) III-V GROUP COMPOUND DEVICES WITH IMPROVED EFFICIENCY AND DROOP RATE

(75) Inventors: Zhen-Yu Li, Chiayi County (TW); Hon-Way Lin, Hsinchu (TW); Chung-Pao Lin, New Taipei (TW); Hsing-Kuo Hsia, Hsin Chu County (TW); Hao-Chung Kuo, Hsin-Tsu County (TW)

(73) Assignee: TSMC Solid State Lighting Ltd., Hsinchu (TW)

( * ) Notice: Subject to any disclaimer, the term of this patent is extended or adjusted under 35 U.S.C. 154(b) by 39 days.

(21) Appl. No.: 13/616,299

(22) Filed: Sep. 14, 2012

(65) Prior Publication Data

US 2014/0077152 A1    Mar. 20, 2014

(51) Int. Cl.
*H01L 33/06* (2010.01)
*B82Y 20/00* (2011.01)
(Continued)

(52) U.S. Cl.
CPC ............... *H01L 33/06* (2013.01); *B82Y 20/00* (2013.01); *F21K 9/00* (2013.01); *F21S 6/00* (2013.01); *F21V 3/049* (2013.01); *F21V 7/22* (2013.01); *F21V 29/74* (2015.01); *F21Y 2101/02* (2013.01); *F21Y 2101/025* (2013.01); *H01L 21/02458* (2013.01); *H01L 21/02507* (2013.01); *H01L 33/32* (2013.01); *H01S 5/0014* (2013.01); *H01S 5/3407* (2013.01); *H01S 5/34333* (2013.01)

(58) Field of Classification Search
CPC ........................................................ H01L 33/06

USPC .......... 257/9–39, 47–103, E33.013, E33.014; 438/22–47
See application file for complete search history.

(56) References Cited

U.S. PATENT DOCUMENTS 8,586,965 B2 * 11/2013 Toyoda et al. .................. 257/14
2009/0152586 A1 * 6/2009 Lee et al. ....................... 257/103
(Continued)

OTHER PUBLICATIONS

Wang, C. H., et al, Efficiency droop alleviation in InGaN/GaN light-emitting diodes by graded-thickness multiple quantum wells, Appl. Phys. Lett. 97, 181101 (2010); doi: 10.1063/1.3507891, 4 pages.

*Primary Examiner* — Steven J Fulk
*Assistant Examiner* — Eric Ward
(74) *Attorney, Agent, or Firm* — Muncy, Geissler, Olds & Lowe, P.C.

(57) ABSTRACT

The present disclosure involves an illumination apparatus. The illumination apparatus includes an n-doped semiconductor compound layer, a p-doped semiconductor compound layer spaced apart from the n-doped semiconductor compound layer, and a multiple-quantum-well (MQW) disposed between the first semiconductor compound layer and the second semiconductor compound layer. The MQW includes a plurality of alternating first and second layers. The first layers of the MQW have substantially uniform thicknesses. The second layers have graded thicknesses with respect to distances from the p-doped semiconductor compound layer. A subset of the second layers located most adjacent to the p-doped semiconductor compound layer is doped with a p-type dopant. The doped second layers have graded doping concentration levels that vary with respect to distances from the p-doped semiconductor layer.

20 Claims, 10 Drawing Sheets

(51) Int. Cl.
| | |
|---|---|
| H01L 33/32 | (2010.01) |
| F21K 99/00 | (2010.01) |
| F21S 6/00 | (2006.01) |
| F21V 3/04 | (2006.01) |
| F21V 7/22 | (2006.01) |
| F21Y 101/02 | (2006.01) |
| H01L 21/02 | (2006.01) |
| H01S 5/00 | (2006.01) |
| H01S 5/34 | (2006.01) |
| H01S 5/343 | (2006.01) |
| F21V 29/74 | (2015.01) |

(56) References Cited

U.S. PATENT DOCUMENTS

| | | | |
|---|---|---|---|
| 2010/0019223 A1* | 1/2010 | Kang et al. | 257/13 |
| 2010/0032646 A1* | 2/2010 | Tanaka | 257/13 |
| 2010/0176372 A1* | 7/2010 | Yoo et al. | 257/13 |
| 2011/0187294 A1* | 8/2011 | Bergmann et al. | 315/363 |
| 2012/0235116 A1* | 9/2012 | Su et al. | 257/13 |
| 2013/0214281 A1* | 8/2013 | Li et al. | 257/76 |
| 2013/0270515 A1* | 10/2013 | Fu | 257/13 |

* cited by examiner

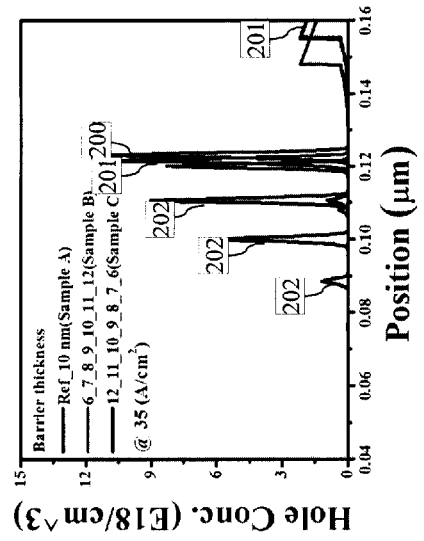
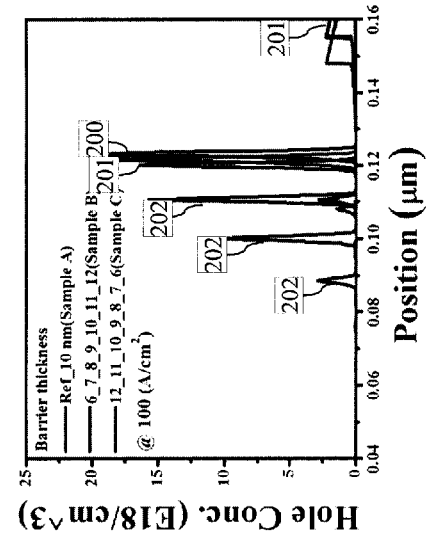
Fig. 4A
Fig. 4B
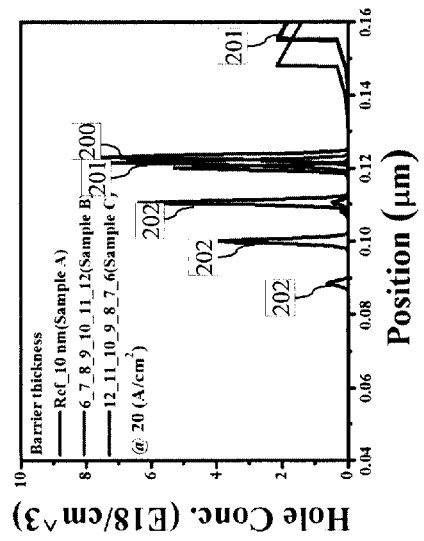
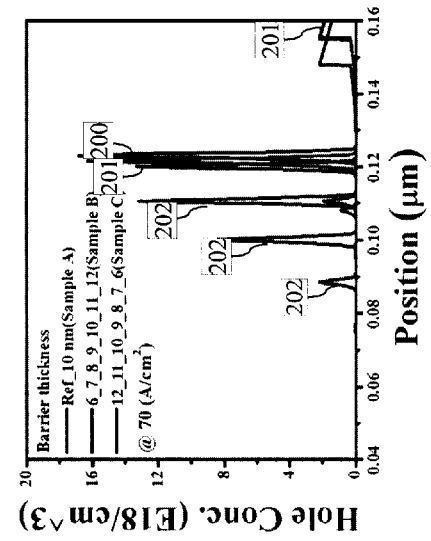
Fig. 4C
Fig. 4D

III-V GROUP COMPOUND DEVICES WITH IMPROVED EFFICIENCY AND DROOP RATE

TECHNICAL FIELD

The present disclosure relates generally to III-V group compound devices, and more particularly, to improving the efficiency and droop rate of III-V group compound devices such as gallium nitride (GaN) devices.

BACKGROUND

The semiconductor industry has experienced rapid growth in recent years. Technological advances in semiconductor materials and design have produced various types of devices that serve different purposes. The fabrication of some types of these devices may require forming one or more III-V group compound layer on a substrate, for example forming a gallium nitride layer on a substrate. Devices using III-V group compounds may include light-emitting diode (LED) devices, laser diode (LD) devices, radio frequency (RF) devices, high electron mobility transistor (HEMT) devices, and/or high power semiconductor devices. Some of these devices, such as LED devices and LD devices, involve forming a quantum well having multiple pairs of active layers and barrier layers. The quantum well generates light when a voltage is applied. However, traditional LED and LD devices have quantum wells that have poor electron-hole recombination, thereby leading to reduced output power and large efficiency droop for the LED and LD devices.

Therefore, while existing LED and LD devices have been generally adequate for their intended purposes, they have not been entirely satisfactory in every aspect. LED and LD devices having better electron-hole recombination continue to be sought.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 4-6 are plots illustrating experimental data according to various aspects of the present disclosure.

DETAILED DESCRIPTION

Figure 1:
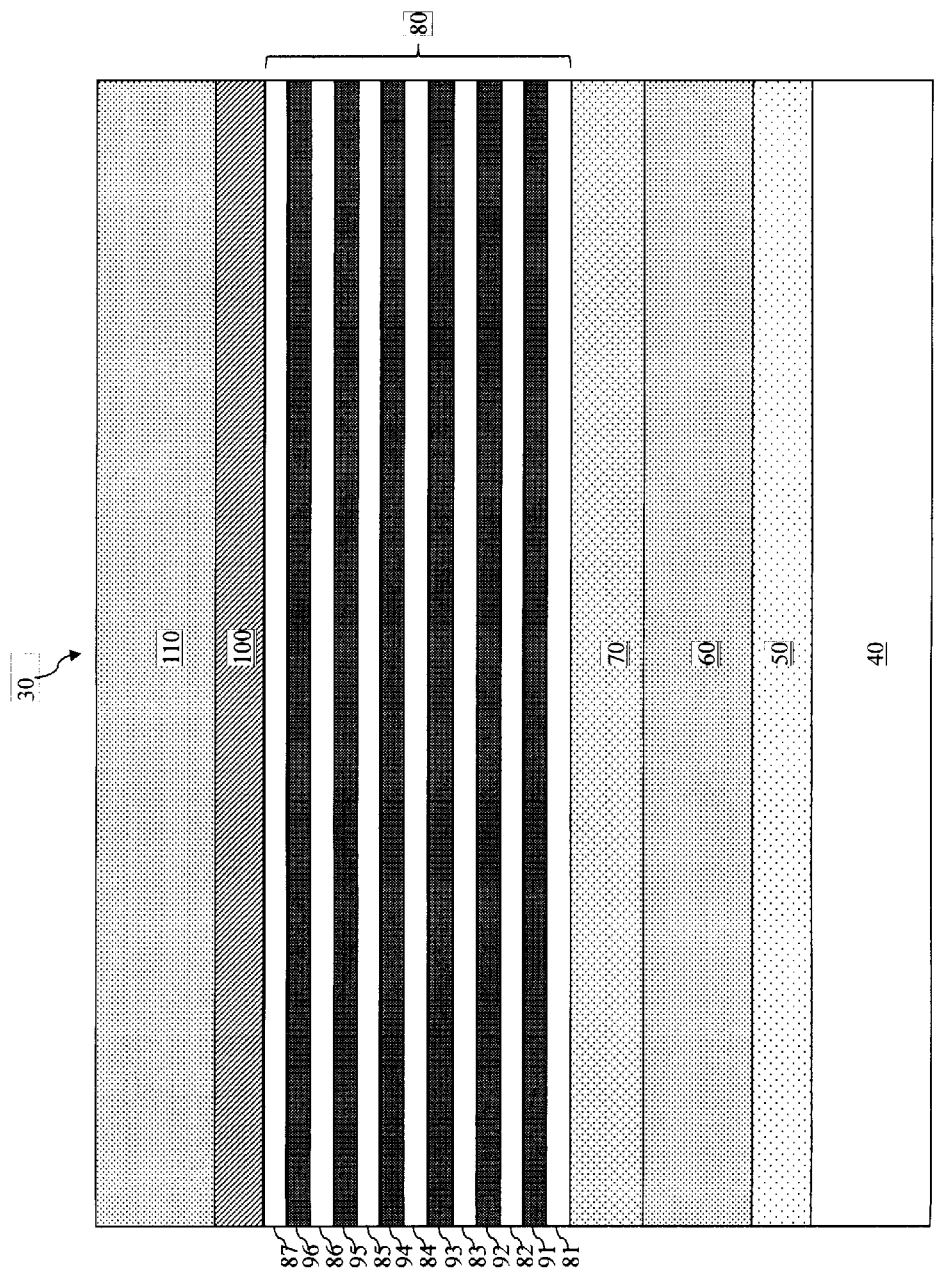
FIGS. 1-3 are diagrammatic fragmentary cross cross-sectional side views of example LED structures according to various aspects of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Moreover, the terms "top," "bottom," "under," "over," and the like are used for convenience and are not meant to limit the scope of embodiments to any particular orientation. Various features may also be arbitrarily drawn in different scales for the sake of simplicity and clarity. In addition, the present disclosure may repeat reference numerals and/or letters in the various examples. This repetition is for the purpose of simplicity and clarity and does not in itself necessarily dictate a relationship between the various embodiments and/or configurations discussed.

As semiconductor fabrication technologies continue to advance, III-V group compounds (also referred to as III-V family compounds or group III-V compounds) have been utilized to produce a variety of devices, such as light-emitting diode (LED) devices, laser diode (LD) devices, radio frequency (RF) devices, high electron mobility transistor (HEMT) devices, and high power semiconductor devices. A III-V compound contains an element from a "III" group (or family) of the periodic table, and another element from a "V" group (or family) of the periodic table. For example, the III group elements may include Boron, Aluminum, Gallium, Indium, and Titanium, and the V group elements may include Nitrogen, Phosphorous, Arsenic, Antimony, and Bismuth.

Some of these III-V group compound devices, such as LEDs and LDs, contain a quantum well for emitting radiation such as different colors of light in a visible spectrum, as well as radiation with ultraviolet or infrared wavelengths. Compared to traditional light sources (e.g., incandescent light bulbs), LEDs and LDs offer advantages such as smaller size, lower energy consumption, longer lifetime, variety of available colors, and greater durability and reliability. These advantages, as well as advancements in LED and LD fabrication technologies that have made LEDs and LDs cheaper and more robust, have added to the growing popularity of LEDs and LDs in recent years.

Nevertheless, existing LEDs and LDs may have certain shortcomings. One such shortcoming is that the quantum well for existing LEDs and LDs may have poor electron-hole recombination, thereby leading to reduced power output and a large efficiency droop.

Figure 2:
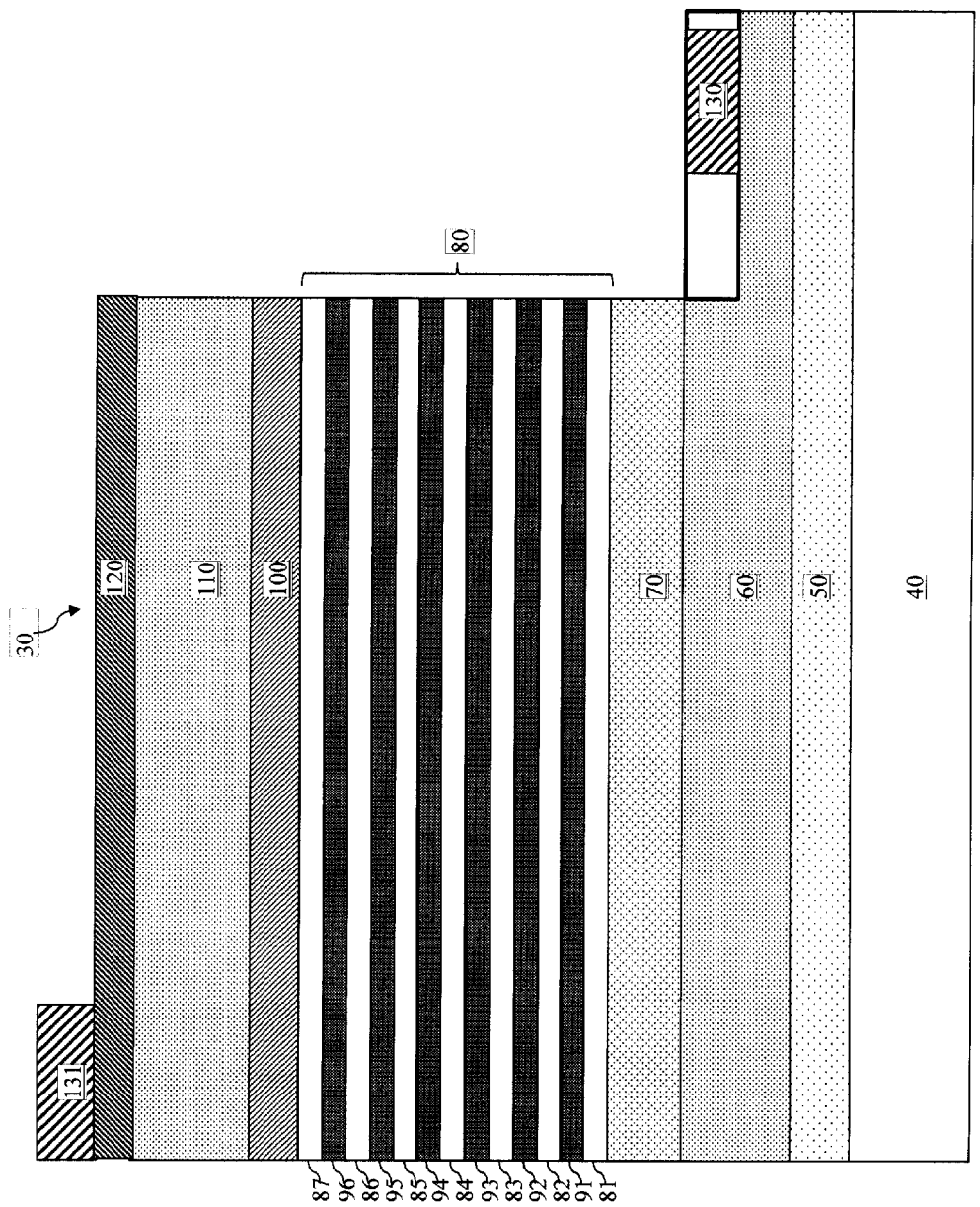
Figure 3:
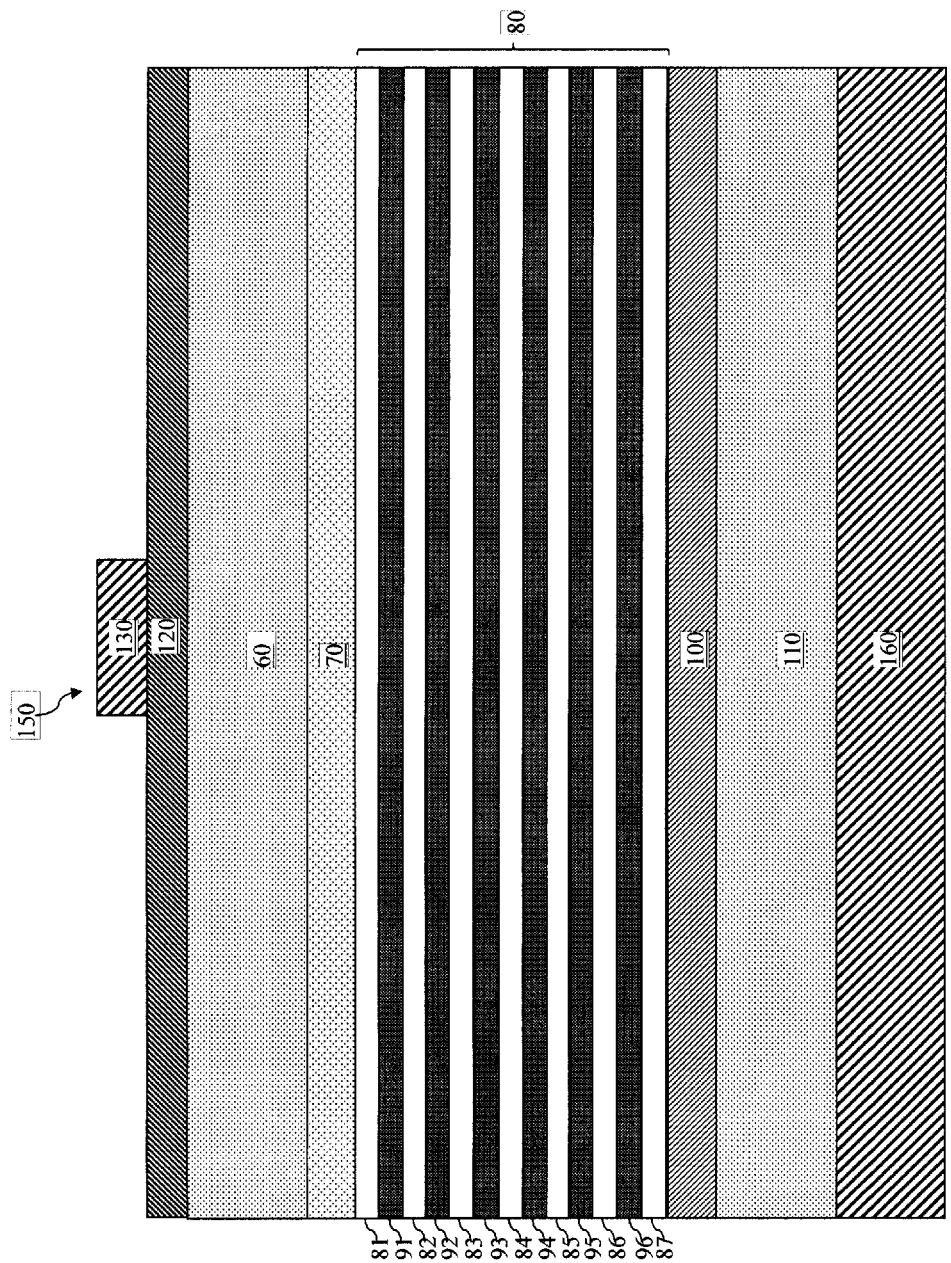
Figure 5A:
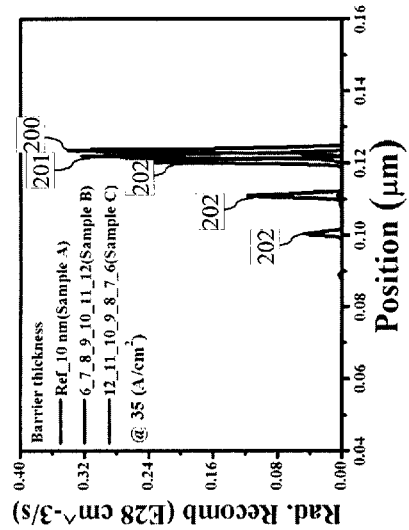
Figure 5B:
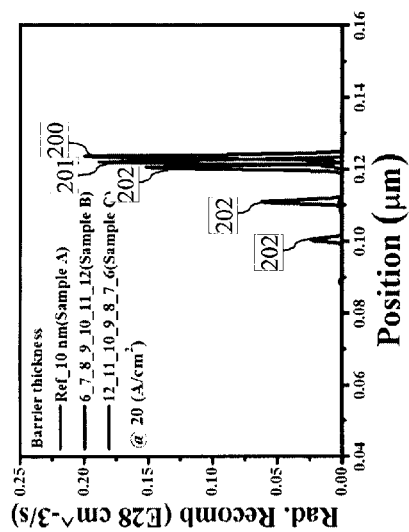
Figure 5C:
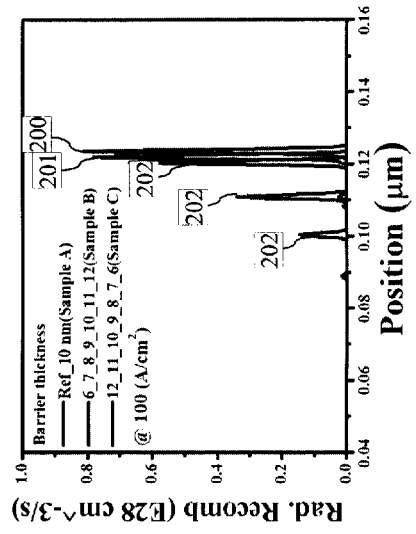
Figure 5D:
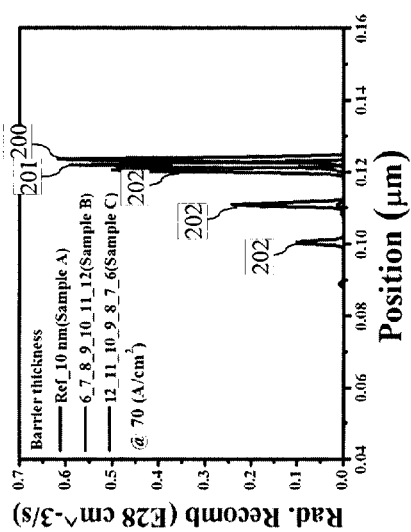

According to various aspects of the present disclosure, described below is a photonic device having a quantum well with improved electron-hole recombination so as to increase output power and reduce the efficiency droop associated with existing LEDs and LDs. In some embodiments, the photonic device includes a horizontal LED. In some embodiments, the photonic device includes a vertical LED. FIGS. 1 to 3 are diagrammatic cross-sectional side views of a portion of the LEDs at various fabrication stages. FIGS. 1 to 3 have been simplified for a better understanding of the inventive concepts of the present disclosure.

Referring to FIG. 1, a horizontal LED 30 is illustrated. The horizontal LED 30 includes a substrate 40. The substrate 40 is a portion of a wafer. In some embodiments, the substrate 40 includes a sapphire material. In other embodiments, the substrate 40 may include a silicon carbide material or a silicon material. The substrate 40 may have a thickness that is in a range from about 50 microns (um) to about 1000 um. In some embodiments, a low temperature buffer film may be formed over the substrate 40. For reasons of simplicity, however, the low temperature buffer film is not illustrated herein.

An undoped semiconductor layer 50 is formed over the substrate 40. The undoped semiconductor layer 50 is free of a p-type dopant or an n-type dopant. In some embodiments, the undoped semiconductor layer 50 includes a compound that contains an element from the "III" group (or family) of the periodic table, and another element from the "V" group (or family) of the periodic table. In the illustrated embodiments, the undoped semiconductor layer 50 includes an undoped gallium nitride (GaN) material.

The undoped semiconductor layer 50 can also serve as a buffer layer (for example, to reduce stress) between the substrate 40 and layers that will be formed over the undoped semiconductor layer 50. To effectively perform its function as a buffer layer, the undoped semiconductor layer 50 has reduced dislocation defects and good lattice structure quality. In certain embodiments, the undoped semiconductor layer 50 has a thickness that is in a range from about 1 um to about 5 um.

A doped semiconductor layer 60 is formed over the undoped semiconductor layer 50. The doped semiconductor layer 60 is formed by an epitaxial growth process known in the art. In the illustrated embodiments, the doped semiconductor layer 60 is doped with an n-type dopant, for example Carbon (C) or Silicon (Si). In alternative embodiments, the doped semiconductor layer 60 may be doped with a p-type dopant, for example Magnesium (Mg). The doped semiconductor layer 60 includes a III-V group compound, which is gallium nitride in the present embodiment. Thus, the doped semiconductor layer 60 may also be referred to as a doped gallium nitride layer. In some embodiments, the doped semiconductor layer 60 has a thickness that is in a range from about 2 um to about 6 um.

A pre-strained layer 70 is formed on the doped semiconductor layer 60. The pre-strained layer 70 may be doped with an n-type dopant such as Silicon. The pre-strained layer 70 may serve to release strain and reduce a quantum-confined Stark effect (QCSE)—describing the effect of an external electric field upon the light absorption spectrum of a quantum well that is formed thereabove (i.e., the MQW layer 80 discussed below). In some embodiments, the pre-strained layer 70 contains a single $In_xGa_{1-x}N$ layer, where x is greater than 0 but less than 0.25. In some other embodiments, the pre-strained layer 70 includes a super-lattice structure. For example, the super-lattice structure may contain $In_xGa_{1-x}N$ (where x is greater than 0 but less than 0.2) and GaN layers. The pre-strained layer 70 may have a thickness in a range from about 30 nanometers (nm) to about 200 nm.

A multiple-quantum well (MQW) layer 80 is formed over the pre-strained layer 70. The MQW layer 80 includes a plurality of alternating (or periodic) active and barrier layers (also referred to as sub-layers). The active layers include indium gallium nitride (InGaN), and the barrier layers include gallium nitride (GaN). For the sake of providing an example, seven barrier layers 81-87 and six active layers 91-96 are illustrated in FIG. 1 as an example MQW layer 80. The barrier layers 81-87 and the active layers 91-96 are disposed in an interleaving manner. The various aspects of the barrier layers 81-87 and the active layers 91-96 will be discussed in more detail below.

An electron blocking layer 100 may optionally be formed over the MQW layer 80. The electron blocking 100 layer helps confine electron-hole carrier recombination within the MQW layer 80, which may improve quantum efficiency of the MQW layer 80 and reduce radiation in undesired bandwidths. In some embodiments, the electron blocking layer 100 may include a doped aluminum gallium nitride (AlGaN) material, and the dopant may include a p-type dopant such as Magnesium. The electron blocking layer 100 may have a thickness in a range from about 15 nm to about 30 nm.

A doped semiconductor layer 110 is formed over the electron blocking layer 100 (and thus over the MQW layer 80). The doped semiconductor layer 110 is formed by an epitaxial growth process known in the art. In some embodiment, the doped semiconductor layer 110 is doped with a dopant having an opposite (or different) type of conductivity from that of the doped semiconductor layer 60. Thus, in the embodiment where the doped semiconductor layer 60 is doped with an n-type dopant, the doped semiconductor layer 110 is doped with a p-type dopant. The doped semiconductor layer 110 includes a III-V group compound, which is a gallium nitride compound in the illustrated embodiments. Thus, the doped semiconductor layer 110 may also be referred to as a doped gallium nitride layer. In some embodiments, the doped semiconductor layer 110 has a thickness that is in a range from about 150 nm to about 200 nm.

A core portion of the LED 30 is created by the disposition of the MQW layer 80 between the doped layers 60 and 110. When an electrical voltage (or electrical charge) is applied to the doped layers of the LED 30, the MQW layer 80 emits radiation such as light. The color of the light emitted by the MQW layer 80 corresponds to the wavelength of the radiation. The radiation may be visible, such as blue light, or invisible, such as ultraviolet (UV) light. The wavelength of the light (and hence the color of the light) may be tuned by varying the composition and structure of the materials that make up the MQW layer 80.

As discussed above, existing MQWs may have inadequate electron-hole recombination rates. As a result, output power for existing LEDs may be low, and there may be a large efficiency droop as well. To overcome these problems plaguing existing LEDs, the LED 30 of the present disclosure utilizes graded thicknesses (i.e., vertical dimensions in FIG. 1) for the barrier layers 81-87 in the MQW layer 80. In more detail, the active layers 91-96 have substantially constant or uniform thicknesses. That is, the respective thicknesses for the active layers 81-87 do not vary much from one another. In some embodiments, the thicknesses for the active layers 81-87 are within a range from about 2 nm to about 3.5 nm. On the other hand, according to various aspects of the present disclosure, the barrier layers 81-87 have thicknesses as a function of their respective distances from the p-doped semiconductor layer 110 (or from the electron blocking layer 100). The closer the barrier layers 81-87 are to the p-doped semiconductor layer 110, the thinner they become. Thus, the barrier layer 81 is the thickest barrier layer in the MQW layer 80 because it is located farthest from the p-doped semiconductor layer 110, the barrier layer 82 is thinner than the barrier layer 81 because it is located closer to the p-doped semiconductor layer 110, so on and so forth, and the barrier layer 87 is the thinnest barrier layer in the MQW layer 80.

In some embodiments, the thicknesses for the barrier layers 81-87 vary within 5%-15% between adjacent barrier layers. In other words, the barrier layer 82 is thinner than the barrier layer 81 by about 5%-15%, the barrier layer 83 is thinner than the barrier layer 82 by about 5%-15%, so on and so forth. For example, the thicknesses for the barrier layers 81-87 may be about 12 nm, 11 nm, 10 nm, 9 nm, 8 nm, 7 nm, and 6 nm. Of course, different thicknesses may be chosen for these barrier layers depending on design requirements and manufacturing concerns in other embodiments.

It is also understood that the thicknesses of the barrier layers do not always have to decrease as the barrier layers get closer to the p-doped semiconductor layer 110. It is envisioned that in some other embodiments, the thicknesses between two or more adjacent barrier layers may stay relative the same, as long as the overall trend is that the barrier layers become thinner as they approach the p-doped semiconductor layer 110.

The graded thicknesses for the barrier layers 81-87 improve a hole injection rate, thereby improving electron-hole combination rates. In more detail, the decay of carrier concentration is a function of distance. In the case of holes, its concentration is the greatest near the p-doped semiconductor layer 110 and the lowest near the n-doped semiconductor layer 60. The decay of the hole concentration may be exponential, that is, the decay of the hole concentration will speed up drastically the farther it gets from the p-doped semiconductor layer 110. As a result, for conventional LEDs, holes cannot be easily moved (i.e., low mobility), especially under high current conditions. This results in a large efficiency droop.

According to the present disclosure, the barrier layers 81-87 have decreasing thicknesses from the n-doped semiconductor layer 60 to the p-doped semiconductor layer 110. Such graded thickness pattern for the barrier layers 81-87 means that the holes can now travel more easily from the p-doped semiconductor layer 110 toward the n-doped semiconductor layer 60. As a result, substantially every layer of the MQW layer 80 has an improved hole concentration (and a better hole injection rate) compared to conventional LED devices. The improvement in hole mobility and hole concentration in the MQW layer 80 leads to better electron-hole recombination rates, which reduces droop and increases light output.

In addition to having graded barrier layer thicknesses, the MQW layer 80 of the present disclosure also has graded doping for at least a subset of the barrier layers, so as to further enhance electron-hole recombination. In more detail, a subset of the barrier layers that are located the closest to the p-doped semiconductor layer 110 is doped with a p-type dopant, such as Magnesium (Mg). Choosing the number of the barrier layers to be doped involves a trade-off analysis. On the one hand, doping the barrier layers causes the holes to be more spread out in the MQW layer 80, thereby improving the injection rate of holes. This suggests that the more barrier layers that are doped, the better the electron-hole recombination rate will be.

On the other hand, doping the barrier layers may damage the active layers 91-96 in the MQW layer 80, which adversely impacts the quality of the MQW layer 80. Therefore, it is important to choose an optimized number of doped barrier layers, so that the hole injection rate can be substantially improved, and yet damage to the active layers is still minimal. In some embodiments, the subset of the barrier layers that are doped is at least three when there are six or more pairs of active/barrier layers. Thus, the barrier layers 85, 86, and 87 (the closest to the p-doped semiconductor layer 110 in terms of distance) are doped with a p-type dopant such as Mg in the illustrated embodiments.

According to the various aspects of the present disclosure, the doped barrier layers 85, 86, and 87 also have graded doping concentration levels as a function of their respective distances from the p-doped semiconductor layer 110. The closer a barrier layer is to the p-doped semiconductor layer 110, the higher its doping concentration level. Thus, among the three doped barrier layers 85, 86, and 87, the barrier layer 87 has the greatest doping concentration level, the barrier layer 86 has a lower doping concentration level than the barrier layer 87, and the barrier layer 85 has the lowest doping concentration level. In some embodiments, the doping concentration levels for the barrier layers 87, 86, and 85 are $5 \times 10^{17}$ ions/cm$^3$, $4 \times 10^{17}$ ions/cm$^3$, and $3 \times 10^{17}$ ions/cm$^3$, respectively.

Due at least in part to the graded thicknesses for the barrier layers 81-87, and to the subset of barrier layers 85, 86, and 87 having graded doping concentration levels, the MQW layer 80 discussed herein has improved electron-hole recombination compared to traditional MQW layers, especially under high current conditions. Consequently, droop issues plaguing traditional LEDs can be substantially alleviated by the LED 30, and the light output for the LED 30 can be improved as well.

Additional processes may be performed to complete the fabrication of the LED 30. For example, referring to FIG. 2, an electrically-conductive contact layer 120 may be formed over the doped-semiconductor layer 110. A portion of the layer 60 is etched away so that a part of the doped semiconductor layer 60 is exposed. Metal contacts 130-131 may then be formed on the surface of the exposed doped semiconductor layer 60 and on the surface of the contact layer 120, respectively. The metal contacts 130-131 are formed by one or more deposition and patterning processes. The metal contacts 130-131 allow electrical access to the doped semiconductor layer 60 and to the doped semiconductor layer 110, respectively.

The LED 30 having the improved MQW layer 80 as illustrated in FIGS. 1-2 above pertains to a horizontal LED. Similarly, a vertical LED may also be fabricated to incorporate the improved MQW layer 80. For example, FIG. 3 illustrates an example of such vertical LED 150. Similar components in the vertical and horizontal LEDs are labeled the same for reasons of consistency and clarity.

Referring to FIG. 3, the vertical LED 150 has a submount 160. The submount 160 contains a metal material in the illustrated embodiments. In other embodiments, the submount 160 may include a silicon substrate. In yet other embodiments, the submount 160 may include a Metal Core Printed Circuit Board (MCPCB), a lead frame, or a ceramic material. The doped semiconductor layer 110 is disposed on the submount 160. In the embodiment shown, the doped semiconductor layer 110 includes p-doped gallium nitride (p-GaN). The electron blocking layer 100 is disposed on the doped semiconductor layer 110. The MQW layer 80 is disposed on the electron blocking layer 100. The pre-strained layer 70 is disposed on the MQW layer 80. The doped semiconductor layer 60 is disposed on the pre-strained layer 70. In the embodiment shown, the doped semiconductor layer 60 includes n-doped gallium nitride (nGaN). The metal contact 131 is disposed on the contact layer 120. Electrical access to the doped layers of the LED 150 can be gained through the metal contact 131 and the submount 160.

To complete the fabrication of the horizontal LED 30 or the vertical LED 150, additional processes such as dicing, packaging, and testing processes may also be performed, but they are not illustrated herein for the sake of simplicity.

Figure 6:
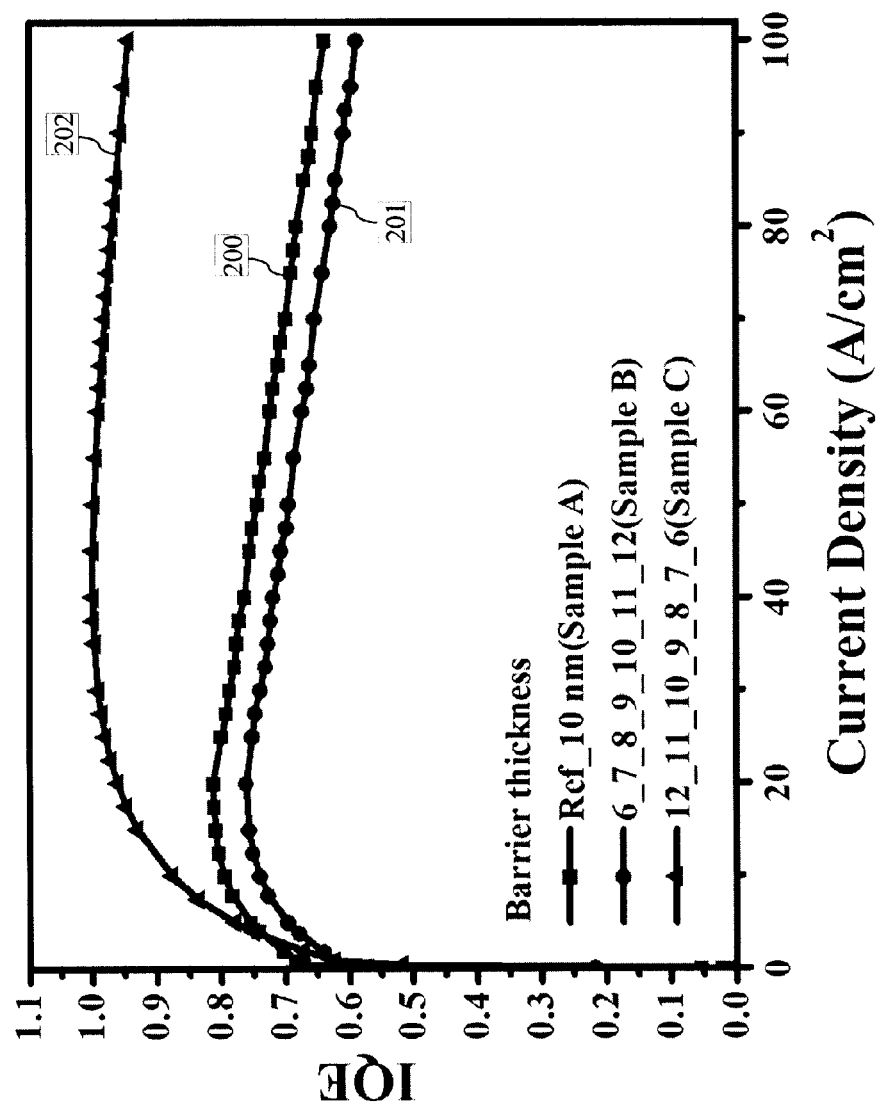

FIGS. 4-6 include plots showing example experimental results to help illustrate the improvements offered by the MQW layer 80 discussed above. FIGS. 4A-4D are plots of hole concentration with respect to position (along the LED). In other words, the horizontal axes of FIGS. 4A-4D represent position along the LED (i.e., vertical positions across the LED in FIGS. 1-3), and the vertical axes of FIGS. 4A-4D represent hole concentrations. Each of the FIGS. 4A-4D corresponds to a different current density—current densities at 20 A/cm$^2$, 35 A/cm$^2$, 70 A/cm$^2$, and 100 A/cm$^2$, respectively.

Each of the FIGS. 4A-4D also include three data sets: dataset 200 for sample A where the barrier layer thicknesses are constant (similar to traditional devices and used as a reference dataset herein), dataset 201 for sample B where the barrier layer thicknesses are graded but in an opposite manner as taught by the present disclosure (i.e., the barrier layers become thicker the closer they are to the p-doped semiconductor layer), and dataset 202 for sample C where the barrier layer thicknesses are graded according to embodiments of the present disclosure.

As can be seen in FIGS. 4A-4D, the dataset 202 (an embodiment of the present disclosure) spans across significantly greater positions along the X-axis than either the dataset 200 or 201. This indicates that the hole concentration for the MQW layer of the present disclosure is much more spread out, whereas the hole concentration for conventional LED devices tends to be congregated in a small region—near the p-doped semiconductor layer. The above holds true regardless of the current density, as the hole concentrations for the dataset 202 span across more positions along the X-axis than the datasets 200-201 even as the current densities increase from FIG. 4A to FIG. 4D. Therefore, the experimental results illustrated in FIGS. 4A-4D confirm that the MQW layer of the present disclosure offers a better hole injection rate than for conventional devices.

FIGS. 5A-5D show experimental results of carrier recombination distribution with respect to position (along the LED). Similar to FIGS. 4A-4D, FIGS. 5A-5D are associated with different current densities. In addition, the datasets 200, 201, and 202 discussed above are in FIGS. 4A-4D are graphed in FIGS. 5A-5D. And as is the case in for hole concentration (as shown in FIGS. 4A-4D), the carrier recombination distribution plots shown in FIGS. 5A-5D indicate that the dataset 202 (i.e., dataset representing an embodiment of the present disclosure) spans across more regions of the LED, rather than being congregated mostly near the p-doped semiconductor layer. In other words, FIGS. 5A-5D show that carrier recombination of the present disclosure has an improved distribution over traditional devices, which leads to high output power.

FIG. 6 is a plot of quantum efficiency versus current density to illustrate the droop rate improvement offered by the present disclosure. In more detail, the X-axis of FIG. 6 represents current density, and the Y-axis of FIG. 6 represents quantum efficiency. Once again, shown in FIG. 6 are dataset 200 (sample A where the barrier layer thicknesses are constant), dataset 201 (sample B where the barrier layer thicknesses are graded but in an opposite manner as taught by the present disclosure), and dataset 202 (sample C where the barrier layer thicknesses are graded according to embodiments of the present disclosure). For datasets 200 and 201, it can be seen that as current density begins to increase, the quantum efficiency reaches a peak and begins to drop. This is referred to as droop or droop rate. The more pronounced the droop, the worse the performance of the LED. In comparison, the quantum efficiency decline as current increases is much smaller for the dataset 202, meaning that the present disclosure offers a significantly improved droop rate (i.e., smaller droop) compared to traditional LED devices. Therefore, the present disclosure leads to performance enhancements.

It is understood that FIGS. 4-6 are merely example experimental results. Other experimental results may vary somewhat from those shown in FIGS. 4-6 without departing from the spirit and the scope of the present disclosure.

Figure 7:
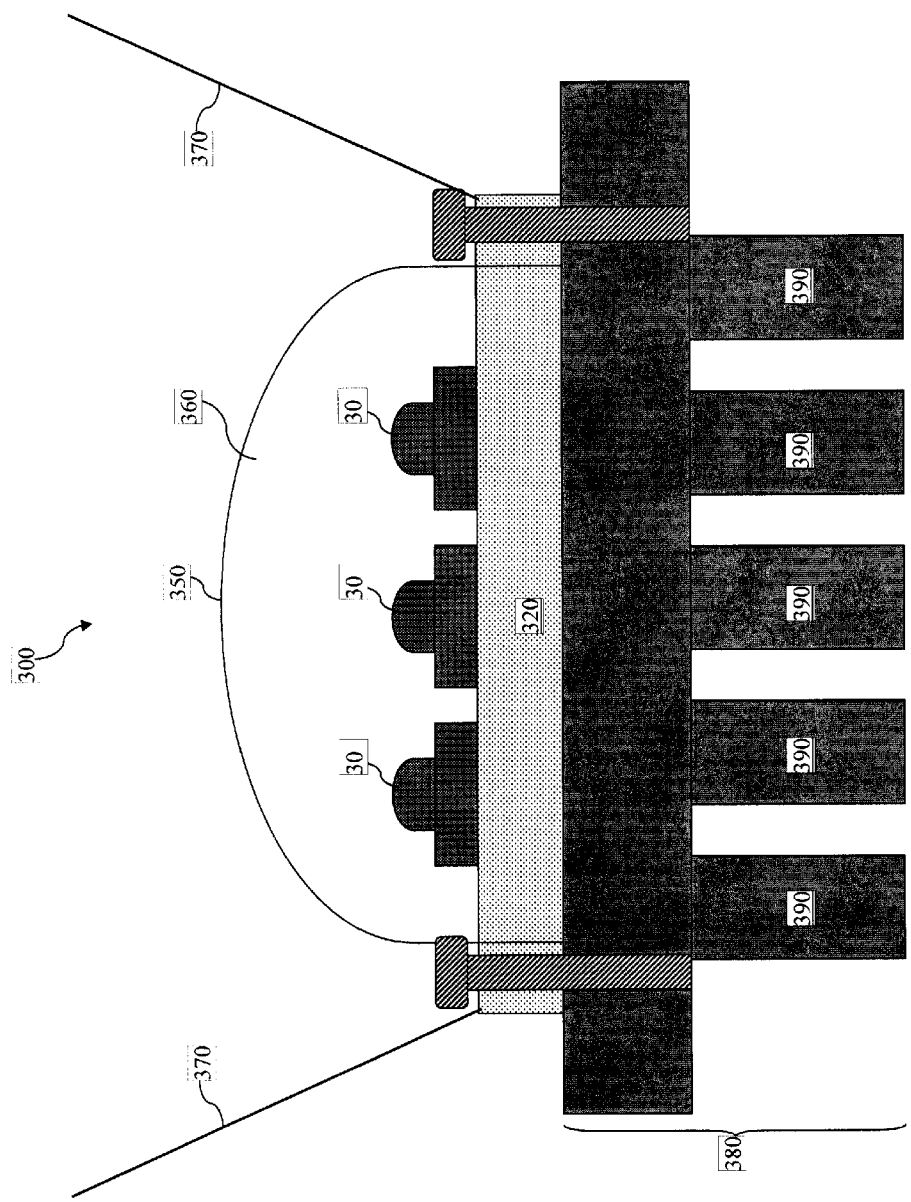
FIG. 7 is a diagrammatic fragmentary cross-sectional side view of an example LED lighting apparatus according to various aspects of the present disclosure.

The LED 30 having the improved MQW layer as discussed above may be implemented as a part of a lighting apparatus. For example, the LED 30 may be implemented as a part of a LED-based lighting instrument 300, a simplified cross-sectional view of which is shown in FIG. 7. The embodiment of the LED-based lighting instrument 300 shown in FIG. 7 includes a plurality of LED dies. In other embodiments, the lighting instrument 300 may include a single LED die.

As discussed above, the LED dies include an n-doped III-V group compound layer, a p-doped III-V group compound layer, and a MQW layer disposed between the n-doped and p-doped III-V compound layers. The MQW layer has graded thicknesses for its barrier layers and/or a subset of doped barrier layers having graded doping concentration levels close to the p-doped III-V compound layer. Due to these improvements in the MQW layer, the LED dies offer less droop and better light output performance compared to traditional LED dies.

In some embodiments, the LED dies 30 each have a phosphor layer coated thereon. The phosphor layer may include either phosphorescent materials and/or fluorescent materials. The phosphor layer may be coated on the surfaces of the LED dies 30 in a concentrated viscous fluid medium (e.g., liquid glue). As the viscous liquid sets or cures, the phosphor material becomes a part of the LED package. In practical LED applications, the phosphor layer may be used to transform the color of the light emitted by an LED dies 30. For example, the phosphor layer can transform a blue light emitted by an LED die 30 into a different wavelength light. By changing the material composition of the phosphor layer, the desired light color emitted by the LED die 30 may be achieved.

The LED dies 30 are mounted on a substrate 320. In some embodiments, the substrate 320 includes a Metal Core Printed Circuit Board (MCPCB). The MCPCB includes a metal base that may be made of aluminum (or an alloy thereof). The MCPCB also includes a thermally conductive but electrically insulating dielectric layer disposed on the metal base. The MCPCB may also include a thin metal layer made of copper that is disposed on the dielectric layer. In alternative embodiments, the substrate 320 may include other suitable thermally conductive structures. The substrate 320 may or may not contain active circuitry and may also be used to establish interconnections. In some other embodiments, the substrate 320 includes a lead frame, a ceramic or a silicon substrate.

The lighting instrument 300 includes a diffuser cap 350. The diffuser cap 350 provides a cover for the LED dies 30 therebelow. Stated differently, the LED dies 30 are encapsulated by the diffuser cap 350 and the substrate 320 collectively. In some embodiments, the diffuser cap 350 has a curved surface or profile. In some embodiments, the curved surface may substantially follow the contours of a semicircle, so that each beam of light emitted by the LED dies 30 may reach the surface of the diffuser cap 350 at a substantially right incident angle, for example, within a few degrees of 90 degrees. The curved shape of the diffuser cap 350 helps reduce Total Internal Reflection (TIR) of the light emitted by the LED dies 30.

The diffuser cap 350 may have a textured surface. For example, the textured surface may be roughened, or may contain a plurality of small patterns such as polygons or circles. Such textured surface helps scatter the light emitted by the LED dies 30 so as to make the light distribution more uniform. In some embodiments, the diffuser cap 350 is coated with a diffuser layer containing diffuser particles.

In some embodiments, a space 360 between the LED dies 30 and the diffuser cap 350 is filled by air. In other embodiments, the space 360 may be filled by an optical-grade silicone-based adhesive material, also referred to as an optical gel. Phosphor particles may be mixed within the optical gel in that embodiment so as to further diffuse light emitted by the LED dies 30.

Though the illustrated embodiment shows all of the LED dies 30 being encapsulated within a single diffuser cap 350, it is understood that a plurality of diffuser caps may be used in other embodiments. For example, each of the LED dies 30 may be encapsulated within a respective one of the plurality of diffuser caps.

The lighting instrument 300 may also optionally include a reflective structure 370. The reflective structure 370 may be mounted on the substrate 320. In some embodiments, the reflective structure is shaped like a cup, and thus it may also be referred to as a reflector cup. The reflective structure encircles or surrounds the LED dies 30 and the diffuser cap 350 in 360 degrees from a top view. From the top view, the reflective structure 370 may have a circular profile, a beehive-like hexagonal profile, or another suitable cellular profile encircling the diffuser cap 350. In some embodiments, the LED dies 30 and the diffuser cap 350 are situated near a bottom portion of the reflective structure 370. Alternatively stated, the top or upper opening of the reflective structure 370 is located above or over the LED dies 30 and the diffuser cap 350.

The reflective structure 370 is operable to reflect light that propagates out of the diffuser cap 350. In some embodiments, the inner surface of reflective structure 370 is coated with a reflective film, such as aluminum, silver, or alloys thereof. It is understood that the surface of the sidewalls of the reflective structure 370 may be textured in some embodiments, in a manner similar to the textured surface of the diffuser cap 350. Hence, the reflective structure 370 is operable to perform further scattering of the light emitted by the LED dies 30, which reduces glare of the light output of the lighting instrument 300 and makes the light output friendlier to the human eye. In some embodiments, the sidewalls of the reflective structure 370 have a sloped or tapered profile. The tapered profile of the reflective structure 370 enhances the light reflection efficiency of the reflective structure 370.

The lighting instrument 300 includes a thermal dissipation structure 380, also referred to as a heat sink 380. The heat sink 380 is thermally coupled to the LED dies 30 (which generate heat during operation) through the substrate 320. In other words, the heat sink 380 is attached to the substrate 320, or the substrate 320 is located on a surface of the heat sink 380. The heat sink 380 is configured to facilitate heat dissipation to the ambient atmosphere. The heat sink 380 contains a thermally conductive material, such as a metal material. The shape and geometries of the heat sink 380 are designed to provide a framework for a familiar light bulb while at the same time spreading or directing heat away from the LED dies 30. To enhance heat transfer, the heat sink 380 may have a plurality of fins 390 that protrude outwardly from a body of the heat sink 380. The fins 390 may have substantial surface area exposed to ambient atmosphere to facilitate heat transfer.

Figure 8:
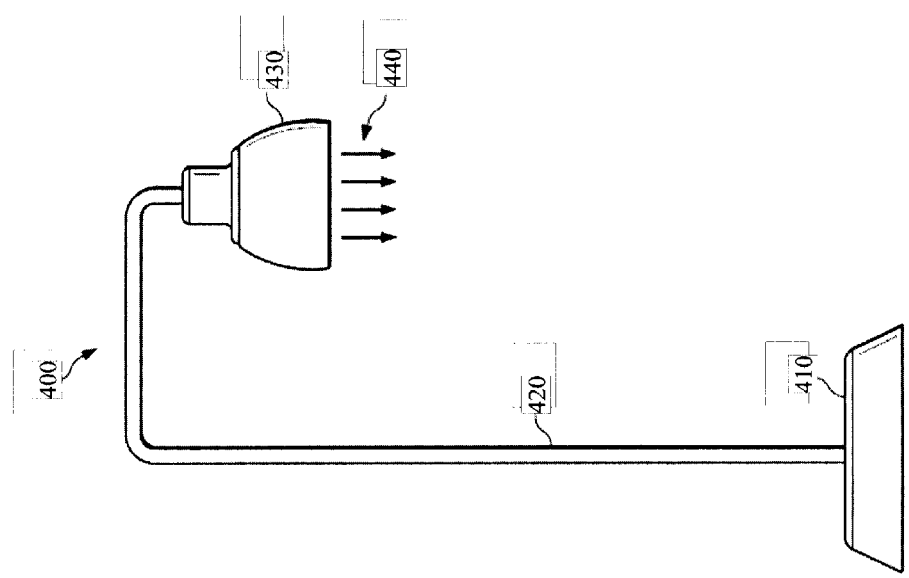
FIG. 8 is a diagrammatic view of a lighting module that includes the LED lighting apparatus of FIG. 7 according to various aspects of the present disclosure.

FIG. 8 illustrates a simplified diagrammatic view of a lighting module 400 that includes some embodiments of the lighting instrument 300 discussed above. The lighting module 400 has a base 410, a body 420 attached to the base 410, and a lamp 430 attached to the body 420. In some embodiments, the lamp 430 is a down lamp (or a down light lighting module). The lamp 430 includes the lighting instrument 300 discussed above with reference to FIG. 7. The lamp 430 is operable to efficiently project light beams 440. In addition, the lamp 430 can offer greater durability and longer lifetime compared to traditional incandescent lamps.

Figure 9:
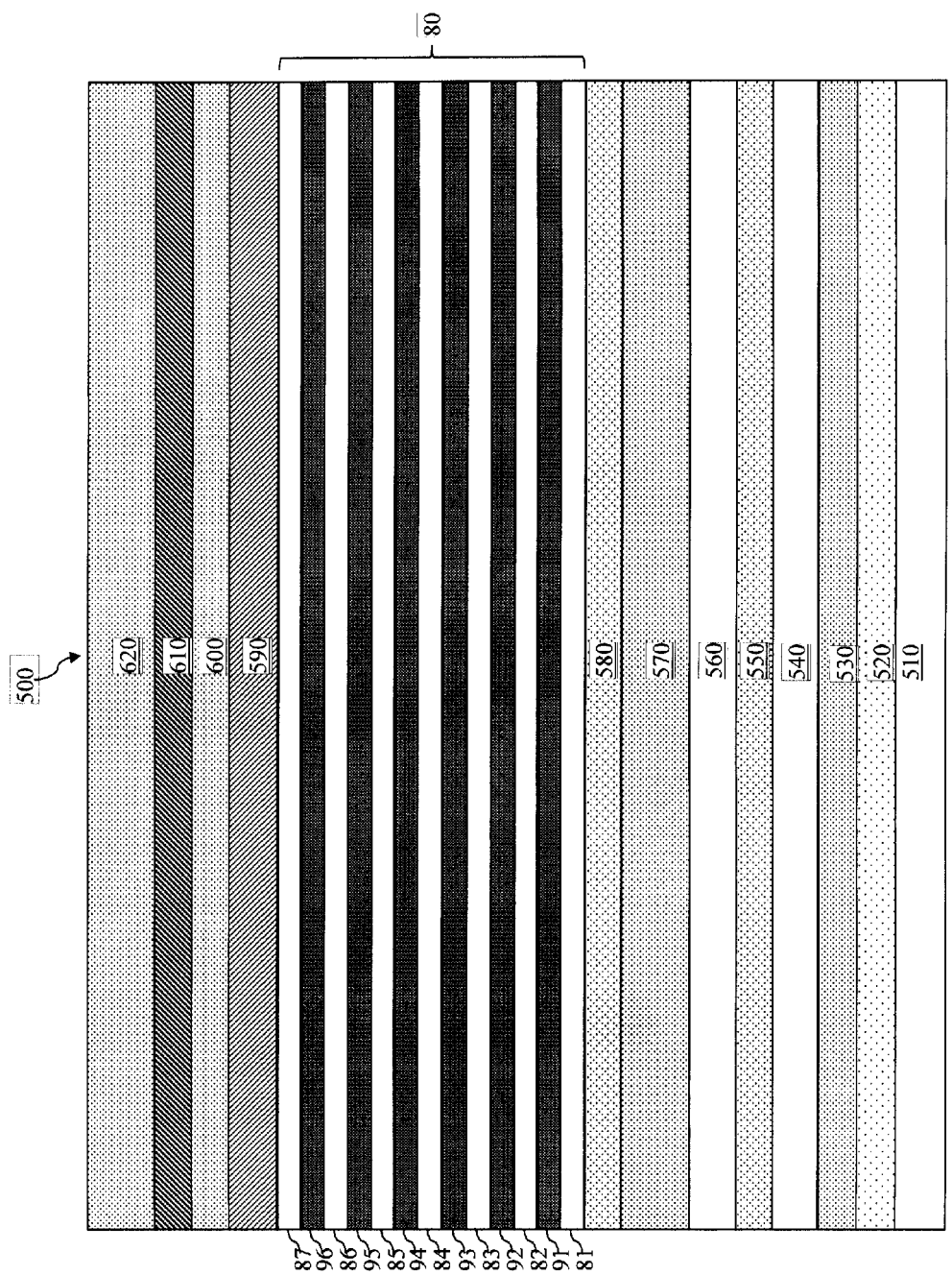
FIG. 9 is diagrammatic fragmentary cross cross-sectional side views of an example LD structures according to various aspects of the present disclosure.

Though the MQW improvements discussed above are illustrated using LEDs as an example, it is understood that similar MQW layers may also be implemented for laser diodes (LDs). FIG. 9 illustrates a simplified cross-sectional side view of an embodiment of the LD 500 according to various aspects of the present disclosure.

The LD 500 includes a substrate 510, which is a silicon substrate in the embodiment shown. A III-V group compound layer 520 is formed over the substrate 510. In some embodiments, the III-V compound layer 520 includes AlN. Another III-V compound layer 530 is formed over the III-V compound layer 510. In some embodiments, the III-V compound layer 530 includes a plurality of sub-layers, for example AlGaN sub-layers. The thicknesses for these sub-layers may increase, and the aluminum content for these sub-layers may decrease, as the sub-layer go up (i.e., farther away from the substrate 510).

A III-V compound epi layer 540 is then formed over the III-V compound layer 530. In some embodiments, the III-V compound epi layer 540 may include GaN. Thereafter, an AlN layer or an AlGaN layer 550 is formed over the III-V compound epi layer 540. Another III-V compound epi layer 560 is then formed over the AlN or AlGaN layer 550.

An n-doped III-V compound layer 570 is then formed over the III-V compound epi layer 560. In some embodiments, the n-doped III-V compound layer 570 includes n-type doped GaN. A plurality of other layers 580 may be formed over the n-doped III-V compound layer 570, for example including an n-doped InGaN layer, a cladding layer containing n-doped InAlGaN, and a guiding layer containing n-doped InGaN.

Thereafter, a MQW layer such as the MQW layer 80 of FIGS. 1-3 may be formed over the layer 580 (and over the n-doped III-V compound layer 570). As discussed above, the MQW layer includes interleaving barrier layers and active layers, where the barrier layers have graded thicknesses, and where a subset of the barrier layers are doped with a graded doping concentration.

An electron blocking layer 590 is formed over the MQW layer 80. In some embodiments, the electron blocking layer 590 includes p-doped InAlGaN. Thereafter, a guiding layer 600 is formed over the electron blocking layer 590. In some embodiments, the guiding layer 600 includes a p-doped InAlGaN. A cladding layer 610 is then formed over the guiding layer. In some embodiments, the cladding layer 610 includes a p-doped InAlGaN. A p-doped III-V compound layer 620 is then formed over the cladding layer 610. In some embodiments, the p-doped III-V compound layer 570 includes p-type doped GaN.

The various layers of the LD 500 discussed above and shown in FIG. 9 are merely example layers. Other LDs may incorporate different layers depending on the design needs.

Figure 10:
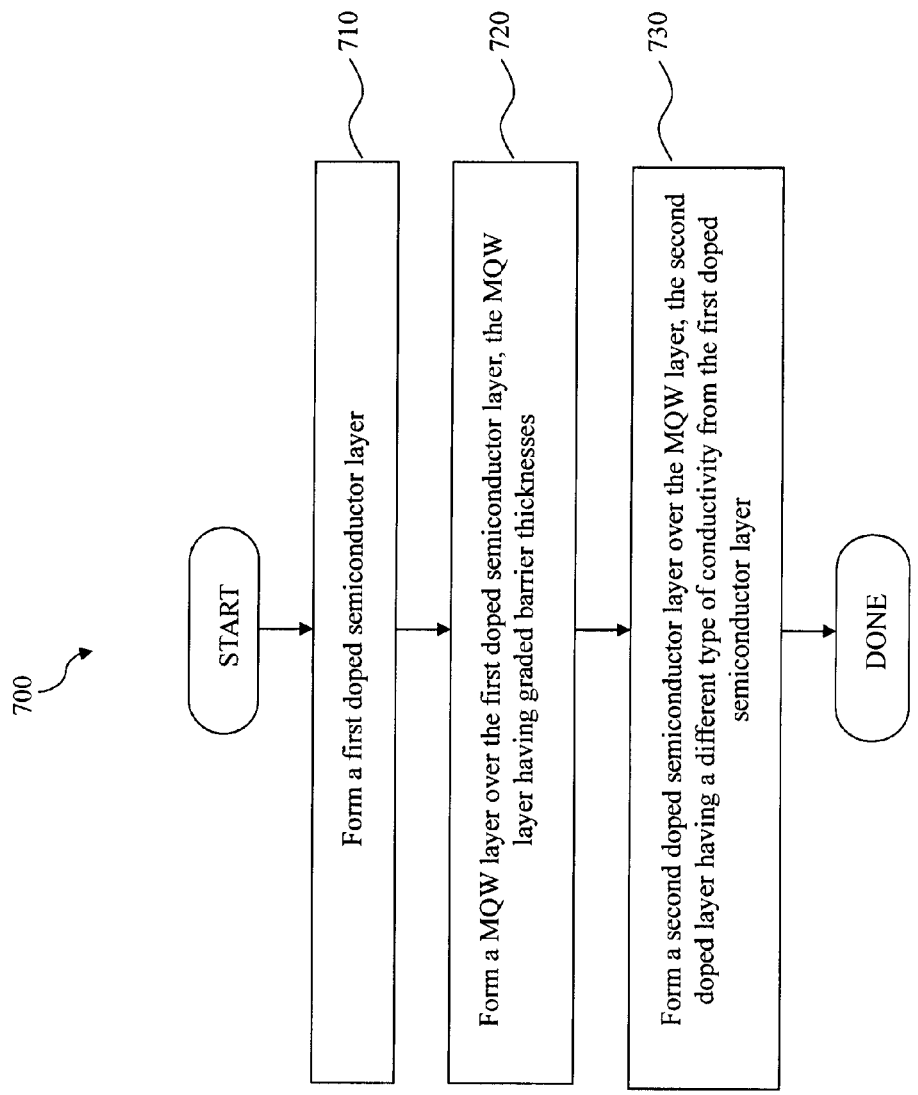
FIG. 10 is a flowchart illustrating a method of fabricating a multiple quantum well for an LED or an LD according to various aspects of the present disclosure.

FIG. 10 is a flowchart illustrating a simplified method 700 of fabricating a MQW layer for a photonic device according to the various aspects of the present disclosure. The photonic device may be a horizontal LED, a vertical LED, or an LD.

The method 700 includes a step 710, in which a first doped semiconductor layer is formed. The first doped semiconductor layer may be formed over a substrate, such as a sapphire substrate for example. In some embodiments, the first doped semiconductor layer includes an n-doped III-V compound material, such as n-doped GaN.

The method 700 includes a step 720, in which a MQW layer is formed over the first doped semiconductor layer. The MQW layer includes a plurality of interleaving barrier layers and active layers. The barrier layers have graded thicknesses in a manner so that the thicknesses decrease as the barrier layer is located farther and farther away from the first doped semiconductor layer. A subset of the barrier layers of the MQW layer is also doped with a p-type dopant such as Mg. In some embodiments, the three barrier layers farthest away from the first doped semiconductor layer are the doped barrier layers. The doped barrier layers also have graded doping concentration levels such that the doping concentration levels increase as the barrier layer is located farther and farther away from the first doped semiconductor layer.

The method 700 includes a step 730, in which a second doped semiconductor layer is formed over the MQW layer. In some embodiments, the second doped semiconductor layer includes a p-doped III-V compound material, such as p-doped GaN.

Additional processes may be performed before, during, or after the blocks 710-730 discussed herein to complete the fabrication of the photonic device. These other processes are not discussed in detail herein for reasons of simplicity.

One aspect the present disclosure involves a photonic device. The photonic device includes: an n-type III-V group layer disposed over a substrate; a p-type III-V group layer disposed over the n-type layer; a quantum well disposed between the n-type III-V group layer and the p-type III-V group layer; wherein: the quantum well includes a plurality of active layers interleaved with a plurality of barrier layers; the active layers have substantially uniform thicknesses; and a respective thickness of each barrier layer is a function of its location with respect to the p-type III-V group layer.

In some embodiments, the function is such that the thicknesses of the barrier layers decrease the closer the barrier layer gets to the p-type III-V group layer.

In some embodiments, a thickness variation between adjacent barrier layers is in a range from about 5% to about 15%.

In some embodiments, the n-type III-V group layer and the p-type III-V group layer include n-doped gallium nitride (n-GaN) and p-doped gallium nitride (p-GaN), respectively; the active layers contain indium gallium nitride (InGaN); and the barriers layers contain gallium nitride (GaN).

In some embodiments, the photonic device includes one of: a light-emitting diode (LED) and a laser diode (LD).

In some embodiments, the photonic device includes a lighting module having a plurality of dies, and wherein the n-type and p-type III-V group layers and the quantum well are implemented in each of the dies.

In some embodiments, a subset of the barrier layers are doped with a p-type dopant. In some embodiments, the subset of the barrier layers include at least three barrier layers that are located the closest to the p-type III-V group layer. Each of the barriers in the subset has a respective doping concentration level that is a function of its location with respect to the p-type III-V group layer. In some embodiments, the doping concentration levels of the barriers in the subset increase the closer the barrier layer gets to the p-type III-V group layer.

Another aspect the present disclosure involves a photonic device. The photonic device includes: an n-type III-V group layer disposed over a substrate; a p-type III-V group layer disposed over the n-type layer; a quantum well disposed between the n-type III-V group layer and the p-type III-V group layer; wherein: the quantum well includes a plurality of active layers interleaved with a plurality of barrier layers; at least some of the barrier layers in the quantum well are doped with a p-type dopant; the doping concentration for the barrier layers that are doped increases as distances between the barrier layer and the p-type III-V group layer become smaller.

In some embodiments, the barrier layers that are doped include at least three barrier layers that have shortest distances from the p-type III-V group layer.

In some embodiments, the active layers have substantially uniform thicknesses; and the barrier layers become thinner as they get closer to the p-type III-V group layer.

In some embodiments, the n-type III-V group layer and the p-type III-V group layer include n-doped gallium nitride (n-GaN) and p-doped gallium nitride (p-GaN), respectively; the active layers contain indium gallium nitride (InGaN); and the barriers layers contain gallium nitride (GaN).

In some embodiments, the photonic device includes one of: a light-emitting diode (LED) and a laser diode (LD).

In some embodiments, the photonic device includes a lighting instrument whose light source includes one or more light-emitting dies, and wherein the n-type and p-type III-V group layers and the quantum well are implemented in each of the one or more light-emitting dies.

Yet another aspect the present disclosure involves an illumination apparatus. The illumination apparatus includes: an n-doped semiconductor compound layer; a p-doped semiconductor compound layer spaced apart from the n-doped semiconductor compound layer; and a multiple-quantum-well (MQW) disposed between the first semiconductor compound layer and the second semiconductor compound layer, the MQW including a plurality of alternating first and second layers; wherein: the first layers of the MQW have substantially uniform thicknesses; the second layers have graded thicknesses with respect to distances from the p-doped semiconductor compound layer; and a subset of the second layers located most adjacent to the p-doped semiconductor compound layer is doped with a p-type dopant and have graded doping concentration levels that vary with respect to distances from the p-doped semiconductor layer.

In some embodiments, the n-doped semiconductor compound layer includes n-doped gallium nitride (n-GaN); the p-doped semiconductor compound layer includes p-doped gallium nitride (p-GaN); the first layer of the MQW includes indium gallium nitride (InGaN); and the second layer of the MQW includes gallium nitride (GaN).

In some embodiments, the second layers become thinner as they approach the p-doped semiconductor compound layer; and the doping concentration levels for the subset of doped second layers become greater as they approach the p-doped semiconductor compound layer.

In some embodiments, the apparatus is a lighting module having a light-emitting diode (LED) or a laser diode (LD) as its light source; and the n-doped semiconductor compound layer, the p-doped semiconductor compound layer, and the MQW are disposed within the LED or the LD.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A photonic device, comprising:
an n-type III-V group layer disposed over a substrate;
a p-type III-V group layer disposed over the n-type layer;
a quantum well disposed between the n-type III-V group layer and the p-type III-V group layer;
wherein:
the quantum well includes a plurality of active layers interleaved with a plurality of barrier layers such that each barrier layer is separated from adjacent barrier layers by a respective one of the active layers;

the active layers have substantially uniform thicknesses;
a subset of the barrier layers are doped with a p-type dopant;
the dopant concentration for the barrier layers in the subset are inversely correlated with distances between the barrier layer and the p-type III-V group layer; and
a thickness of each barrier layer is a function of its location with respect to the p-type III-V group layer such that each barrier layer is thicker than an immediately adjacent barrier layer that is located closer to the p-type III-V group layer.

2. The photonic device of claim 1, wherein the adjacent barrier layers have a variation in thickness, and wherein the variation in thickness between adjacent barrier layers is in a range from about 5% to about 15%.

3. The photonic device of claim 1, wherein:
the n-type III-V group layer includes n-doped gallium nitride (n-GaN);
the p-type III-V group layer includes p-doped gallium nitride (p-GaN);
the active layers contain indium gallium nitride (InGaN); and
the barriers layers contain gallium nitride (GaN).

4. The photonic device of claim 1, wherein the photonic device includes one of: a light-emitting diode (LED) and a laser diode (LD).

5. The photonic device of claim 4, further comprising a lamp in which the LED or the LD are located.

6. The photonic device of claim 1, wherein the photonic device includes a lighting module having a plurality of dies, and wherein the n-type and p-type III-V group layers and the quantum well are implemented in each of the dies.

7. The photonic device of claim 1, wherein the subset of the barrier layers include at least three barrier layers that are located the closest to the p-type III-V group layer.

8. The photonic device of claim 1, wherein each of the barrier layers in the subset has a respective doping concentration level that is a function of its location with respect to the p-type III-V group layer.

9. The photonic device of claim 1, further comprising: a pre-strained layer disposed between the n-type III-V group layer and the quantum well, wherein the pre-strained layer is doped with an n-type dopant and contains a super-lattice structure.

10. The photonic device of claim 1, further comprising an electron blocking layer that is disposed between the p-type III-V group layer and the quantum well.

11. The photonic device of claim 8, wherein the function is such that the doping concentration levels of the barrier layers in the subset increase as distances between the barrier layers and the p-type III-V group layer shrink.

12. A photonic device, comprising:
an n-type III-V group layer disposed over a substrate;
a p-type III-V group layer disposed over the n-type layer;
a quantum well disposed between the n-type III-V group layer and the p-type III-V group layer;
wherein:
the quantum well includes a plurality of active layers interleaved with a plurality of barrier layers such that the barrier layers are not in direct contact with other barrier layers;
at least some of the barrier layers in the quantum well are doped with a p-type dopant;
the doping concentration for the barrier layers that are doped varies from one barrier layer to another barrier layer and increases as distances between the barrier layer and the p-type III-V group layer become smaller;
all of the active layers have substantially uniform thicknesses; and
the barrier layers become thinner as they approach the p-type III-V group layer such that the barrier layer located the closest to the p-type III-V group layer is a thinnest barrier layer, and the barrier layer located the farthest from the p-type III-V group layer is a thickest barrier layer.

13. The photonic device of claim 12, wherein the barrier layers that are doped include at least three barrier layers that have shortest distances from the p-type III-V group layer.

14. The photonic device of claim 12, wherein:
the n-type III-V group layer includes n-doped gallium nitride (n-GaN);
the p-type III-V group layer includes p-doped gallium nitride (p-GaN);
the active layers contain indium gallium nitride (InGaN); and
the barriers layers contain gallium nitride (GaN).

15. The photonic device of claim 12, the photonic device includes one of: a light-emitting diode (LED) and a laser diode (LD).

16. The photonic device of claim 15, further comprising a lamp in which the LED or the LD are located.

17. The photonic device of claim 12, wherein the photonic device includes a lighting instrument whose light source includes one or more light-emitting dies, and wherein the n-type and p-type III-V group layers and the quantum well are implemented in each of the one or more light-emitting dies.

18. An illumination apparatus, comprising:
an n-doped semiconductor compound layer;
a p-doped semiconductor compound layer spaced apart from the n-doped semiconductor compound layer; and
a multiple-quantum-well (MQW) disposed between the first semiconductor compound layer and the second semiconductor compound layer, the MQW including a plurality of alternating first and second layers;
wherein:
the first layers of the MQW have substantially uniform thicknesses;
the second layers have graded thicknesses with respect to distances from the p-doped semiconductor compound layer such that the second layers become thinner as they approach the p-doped semiconductor compound layer; and
a subset of the second layers located most adjacent to the p-doped semiconductor compound layer is doped with a p-type dopant, the subset of the second layers having graded doping concentration levels that vary with respect to distances from the p-doped semiconductor layer such that the doping concentration levels for the subset of doped second layers become greater as they approach the p-doped semiconductor compound layer.

19. The illumination apparatus of claim 18, wherein:
the n-doped semiconductor compound layer includes n-doped gallium nitride (n-GaN);
the p-doped semiconductor compound layer includes p-doped gallium nitride (p-GaN);
the first layer of the MQW includes indium gallium nitride (InGaN); and
the second layer of the MQW includes gallium nitride (GaN).

20. The illumination apparatus of claim 18, wherein:
the apparatus is a lighting module having a light-emitting diode (LED) or a laser diode (LD) as its light source; and the n-doped semiconductor compound layer, the p-doped semiconductor compound layer, and the MQW are disposed within the LED or the LD.

\* \* \* \* \*